United States Patent [19]
Williams

[11] Patent Number: 5,990,687
[45] Date of Patent: Nov. 23, 1999

[54] MEASURING SHIELD BREAKS IN COAXIAL CABLE BY A SHEATH TEST CURRENT

[76] Inventor: Thomas H. Williams, 6423 Fairways Dr., Longmont, Colo. 80503

[21] Appl. No.: 08/865,237

[22] Filed: May 29, 1997

[51] Int. Cl.$^6$ .............................. G01R 31/08; G01R 31/02
[52] U.S. Cl. .......................... 324/529; 324/527; 324/539; 324/541; 324/551
[58] Field of Search ..................................... 324/508, 509, 324/510, 527, 528, 529, 532, 533, 534, 535, 539, 541, 543, 544, 551, 127, 627; 361/42, 45, 49; 340/647, 649, 650

[56] References Cited

U.S. PATENT DOCUMENTS

| | | | |
|---|---|---|---|
| 3,909,712 | 9/1975 | Rietz et al. | 324/533 |
| 4,072,899 | 2/1978 | Shimp | 324/725 |
| 4,114,089 | 9/1978 | Ahmed | 324/509 |
| 4,325,022 | 4/1982 | Pelletier | 324/529 |
| 4,404,514 | 9/1983 | Reichert | 324/533 |
| 4,546,309 | 10/1985 | Kang et al. | 324/509 |
| 4,857,830 | 8/1989 | Matsuno | 324/509 |
| 4,973,911 | 11/1990 | Marshall | 324/628 |
| 5,391,991 | 2/1995 | Tuttle | 324/529 |
| 5,471,144 | 11/1995 | Meyer | 324/509 |
| 5,488,303 | 1/1996 | Bagalini | 324/509 |

FOREIGN PATENT DOCUMENTS 1160337   6/1985   U.S.S.R. ................................ 324/533

OTHER PUBLICATIONS

Williams, Thomas, "Proofing And Maintaining Upstream Cable Plant With Digital Signal Analysis Techniques", Holtzman Engineering, pp. 1–12. (undated).

"The Absorbing Clamp And Its Application For The Measurement of Interference Power", IEC 1986, pp. 165–168. (month unavailable).

Rohdes & Schwarz, "Absorbing Clamps MDS–21 and MDS–22", EN 50083–2, 1995 pp. 1–4, 9–11, 28 & 29. (month unavailble).

*Primary Examiner*—Diep N. Do

[57] ABSTRACT

A system for determining if there is a break in the shield or a compromise in the shielding effectiveness of coaxial cable plant by inducing a reference test signal onto the sheath or outer conductor of a coaxial cable. Concurrent testing is done with a digital sampling receiver for the presence of some of the induced reference signal on the inner or center conductor of the cable. The test current may be introduced directly onto the coax's sheath by magnetically coupling with a split ferrite core, or it may be applied indirectly by inducing the current onto a conductor, such as a grounding wire, that attaches to the coaxial cable. The test signal on the center conductor may be received back at the headend, or it may be received near the injection point by breaking the coaxial cable, or by connecting a probe to the center conductor. The invention may employ ranging to determine the distance to the shield break. This system is particularly useful to detect the source of interference on the upstream or reverse portion of the networks.

22 Claims, 10 Drawing Sheets

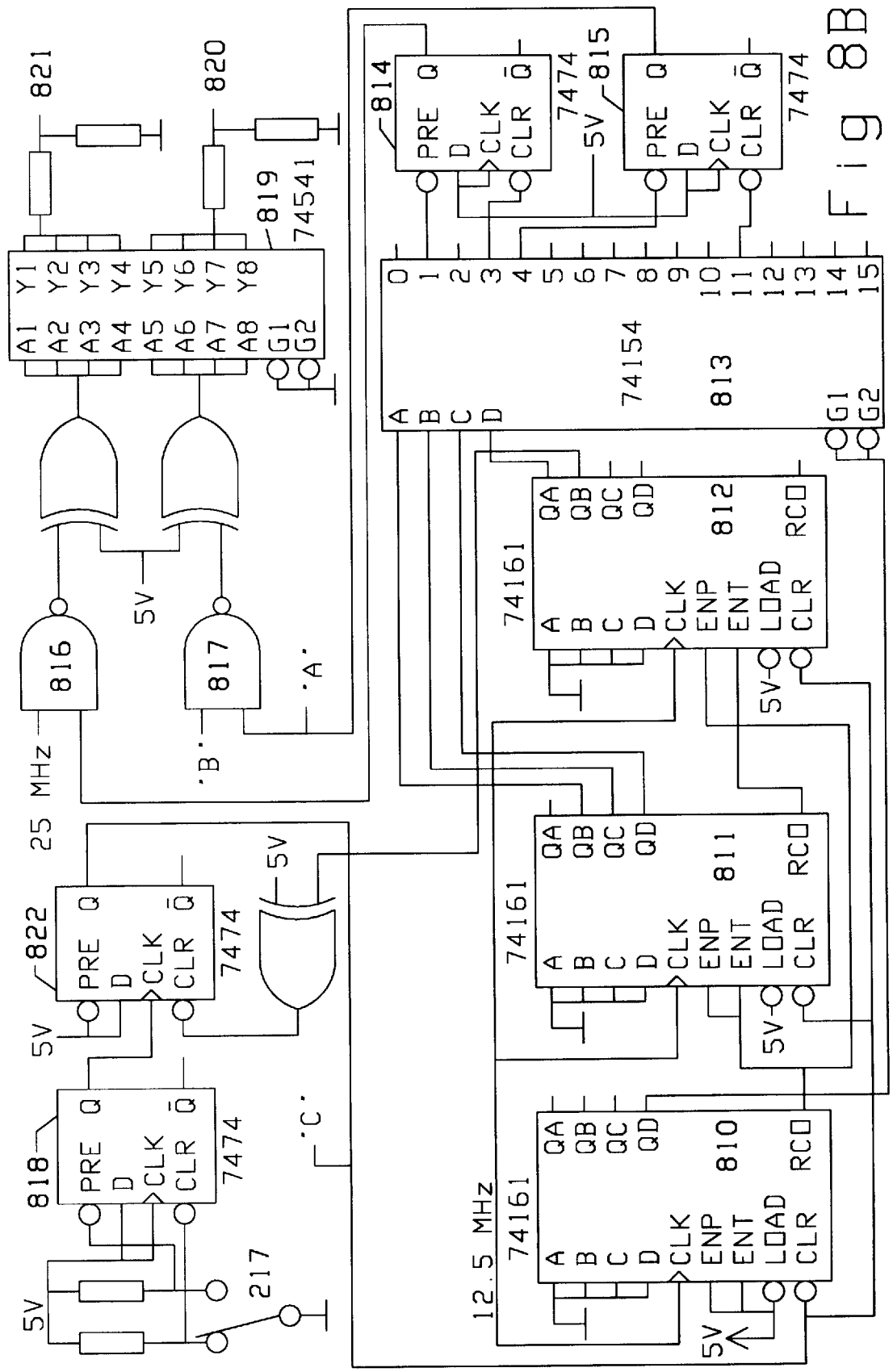

MEASURING SHIELD BREAKS IN COAXIAL CABLE BY A SHEATH TEST CURRENT

BACKGROUND

1. Field of the Invention

This invention relates to systems for testing coaxial cable networks. More particularly, it relates to systems for testing the shielding effectiveness of coaxial cable plant so that defects may be identified and repaired.

2. Description of Prior Art

Cable systems currently in use typically allow two way communications between the headend or distribution hubs and many remote points that may be defined as homes and coaxial drop wires to the homes. A headend is a collection point for both upstream and downstream signals. A distribution hub, which is sometimes used in large systems, is an intermediate point between the headend and the fiber nodes where the downstream signals from the headend are split and the upstream signals are combined. For the sake of this patent, the terms headend and distribution hub may be used interchangeably. One frequently employed architecture is hybrid fiber-coax (HFC). Forward direction, or downstream, signals are transmitted from the headend via optical fibers to fiber nodes. At the fiber node, the downstream transmission is converted from an optical signal to an electrical signal. The signal is distributed from the fiber node to a plurality of remote points, which may be homes, via coaxial cable by splitting. Amplification overcomes the losses of the cable and splitting devices. This portion of the network is referred to as a tree-and-branch system. The downstream frequency range is typically 54 to 550 MHz. This downstream system works well because a high quality signal, which consists of many channels, is produced in the headend. The processes of splitting and amplification can produce many high quality replicas of the headend signal. Downstream signals have traditionally been analog television (TV) carriers. Digital carriers, such as digital audio, digital TV, cable telephone, and computer data, are increasingly being transported by the downstream system.

In the return direction, or upstream, signals are transmitted from the remote points in the 5 to 30 MHz frequency band to the fiber node. The same passive devices that acted as splitters for downstream signals act as combiners for upstream signals. At the fiber optic node, the combined upstream electrical signals are converted to an optical signal for transmission to the headend. Forward and return signals typically travel inside the same coaxial cable in opposite directions. The use of diplex filters allows bidirectional travel inside a single coaxial cable. In the fiber optic bundle, forward and return signals commonly travel in opposite directions in different optic fibers.

The upstream system is problematic because noise that is introduced into one branch can contaminate the signals on all branches because the return signals are combined. This problem is commonly referred to as noise funneling. The use of 5–30 MHz for the return band makes the noise funneling problem even more acute, since man-made electrical noise is strong in this frequency band.

It has been discovered that the most common form of return band impairment is high speed bursts of noise that are typically short but powerful. The noise bursts typically last less than 10 microseconds and have most of their energy content concentrated between 5 and 15 MHz. The noise bursts are sometimes powerful enough to distort, or drive, return active devices into a non-linear mode. The common sources of return noise bursts are the switching of electrical devices, such as inductive loads, or motors with brushes. The switching action creates noise bursts which get onto the electrical utility power lines. Electrical utility power lines are commonly connected to the cable lines at bonding points for safety reasons. Some of the energy of the noise bursts on the power lines are transferred onto the coaxial cable lines at the common bonding points. Because of skin effect, the braided shields on flexible cable lines are low resistance paths for burst energy. The noise burst travels on the sheaths of the cable lines until they are radiated away, dissipated by resistive losses, find their way to ground, branch off, encounter a break in the coaxial cable or are otherwise dissipated. At a break in the coaxial shield, some of the burst noise energy enters the inside of the coaxial cable and travels to the fiber node where it causes interference with return transmissions.

Other signal sources, such as broadcast or two-way ham or citizens band radio traffic also present problems if the plant has a shield break.

Breaks in coaxial cable shields inside homes are caused by poor installation practices, mechanical damage, corrosion, and other causes. Another entry point for noise into the cable system is at consumer electronic devices, such as TVs, video cassette recorders (VCRs) and FM band radios. These devices sometimes have poor tuner isolation, so that noise on the cable shield can enter the inside of the coax at the points in the network where these devices are connected. Consumer electronic devices can be frequency selective by allowing noise in one frequency band into the cable at a higher level than noise in other frequency bands Typical causes of poor shielding integrity in outdoor plant are corrosion, animal chews, screw-on connectors that are not tightened, and housings with loose bolts.

There are multiple failure modes for the shielding integrity of coaxial cable, and shielding effectiveness may be degraded moderately or severely. For the sake of description, any degradation in coaxial cable plant shielding integrity will be referred to as a "shield break".

For a faulty shield upstream transmission problem to occur, two conditions must be simultaneously met. First, a source of undesirable energy must be present on the coaxial sheath. Second, the coaxial sheath must be defective or open at the instant the impairment arrives. Frequently, the coaxial sheath has intermittent continuity and the burst noise source intermittently produces interference. This makes the shield's break point difficult to uncover by observation or passive testing. Additionally, the combining of upstream noise and signals makes it difficult to discover which path the noise burst took to the fiber node.

The traditional method of finding shield breaks is by measuring radiated signal strength from a special narrow bandwidth downstream test signal that is typically located at the high end of the FM radio band. This test method does not adequately find all shield breaks that affect return transmissions. Devices have been recently introduced that can be used to detect shield breaks or shield problems inside homes. One device requires the technician to bring a sensor within a few meters of the break, which mandates entry into the home. Another new device is a reflectometer that allows the technician to stand outside the home and measure the cable's return loss. This device provides distances to discontinuities. This test method does not necessarily provide a distinction between return loss problems caused by bad splitters, missing terminators, consumer electronics devices with poor return loss, staples through cables and shield breaks. If the technician is searching for shield breaks, the other information about conditions inside the cables is confusing and irrelevant.

OBJECTS AND ADVANTAGES

There is a need to uncover and repair shield breaks to allow return services to work well. There has been much discussion about bringing high-speed internet access to homes. One of the fastest and least expensive methods to provide high speed internet access is with cable modems. The presence of shield breaks has made the performance of the modems poor as the noise contaminated data must be re-transmitted. There is also a need to fix shielding problems that create interference with downstream services. If there is a shield break, subscribers downstream from the problem will typically experience signal quality problems with downstream carriers, particularly on channels used by radiated broadcast signals. Shield breaks also allow signal egress that interferes with communications services, such as aeronautical radio navigation systems. While a coaxial shield break typically effects only one or several subscribers of downstream services, it can affect all upstream subscribers in a fiber node.

There is a need for testing devices that can uncover shield breaks. There is also a need to determine if the shield break is caused by a consumer electronic device that is able to pass energy into the center conductor of the cable. There is also a need to determine the distance to the break from the test location to make troubleshooting easier. There is also a need to do effective testing without disrupting service and without gaining entrance to the inside of the house, which may not be possible. There is also a need to test the coaxial cable plant without necessarily climbing utility poles.

DRAWING FIGURES

SUMMARY

In accordance with the present invention, a test system for finding shield breaks comprising a coaxial cable plant, a reference test signal transmitter connected to a primary winding, a secondary winding formed by a coaxial cable, a magnetic coupling device coupling the primary and secondary windings, and a receiver connected to a center conductor of the coaxial cable whereby a shield break causes a reference test signal that has been induced onto the sheath of the coaxial cable plant to be received on the center conductor.

DESCRIPTIONS—FIGS. 1 to 3A

Figure 1:
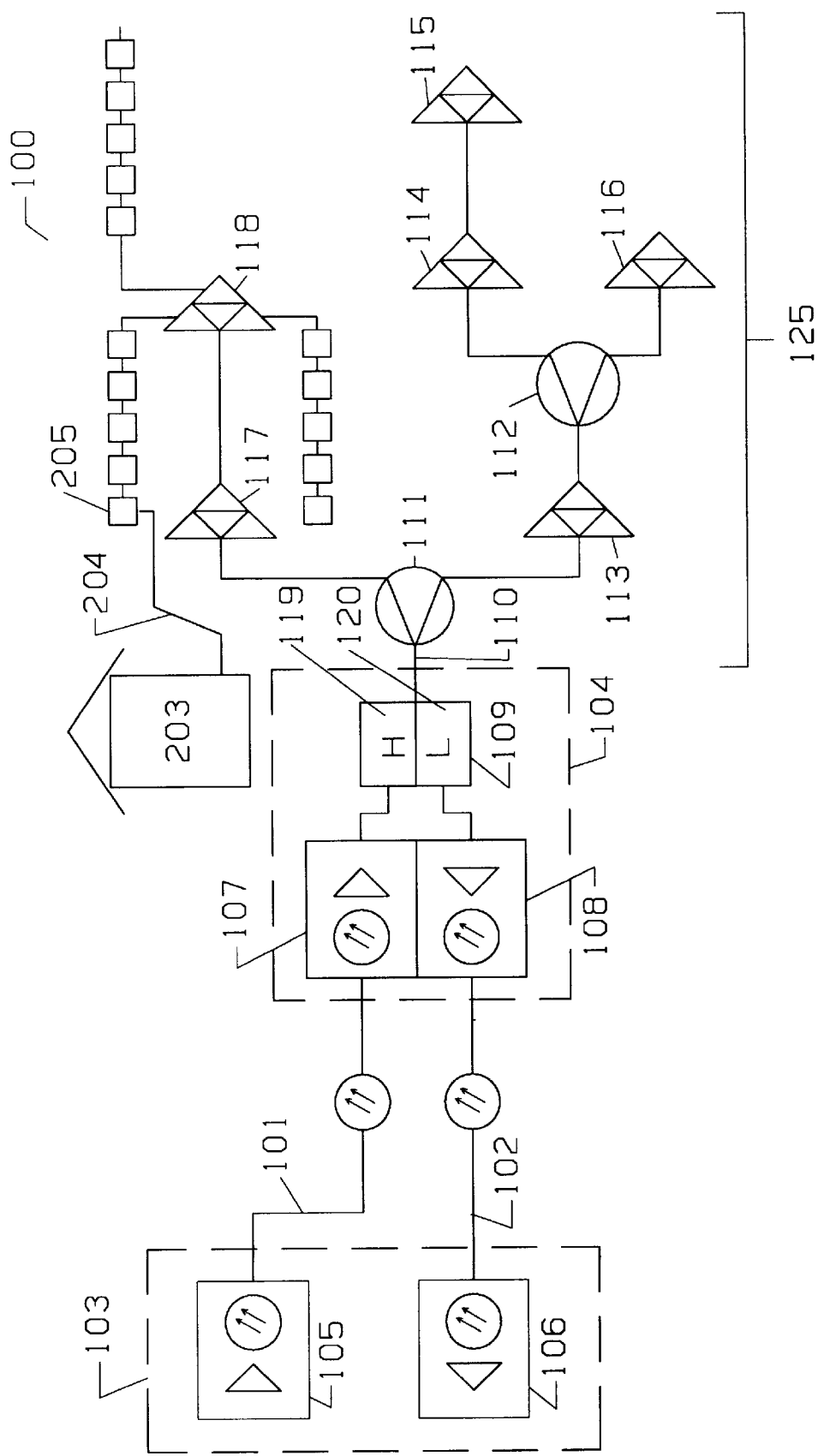
FIG. 1 is a block diagram of a simplified hybrid fiber coax system employing the tree and branch architecture.

FIG. 1 illustrates a bi-directional cable system 100 which employs a single mode fiber optic cable 101 for the long reach from a headend 103 to a fiber node 104. In the headend, which is the collection point for downstream signals, are located a downstream laser transmitter 105 and an upstream laser receiver 106. At the fiber node 104, which is typically housed in a weather tight outdoor housing, a downstream signal is converted from an optical signal into an electrical signal by a downstream laser receiver 107 and an upstream electrical signal is converted into an optical signal by an upstream laser transmitter 108. The upstream and downstream electrical signals are applied to a diplex filter 109 which allows bi-directional signal flow on a same hard line coaxial cable 110. Diplex filters consist of a high-pass section 119 and a low-pass section 120.

Splitter/combiners 111 and 112 split the downstream signals and combine the upstream signals. Two way amplifiers 113–118 boost the signal level in both directions to overcome the loss of the coaxial cable and splitter/combiners. Taps such as a tap 205 are also splitting/combining devices that allow signal extraction and insertion. A coaxial cable plant 125 can be defined as the coaxial portion of the bi-directional cable system 100, which extends from the fiber node 104 to the insides of the houses such as a house 203. Typically, the coaxial cable plant 125 is constructed of solid sheath hard-line aluminum coaxial cable from the fiber node 104 to the tap 205, and a braided shield drop cable 204 is used from the tap to a house 203 as well as inside the house 203. All coaxial cable has a single center conductor which is typically surrounded by a foam dielectric. Hard line coaxial cable has a single shield, and flexible drop coaxial cable normally has multiple shields that are electrically in contact with each other.

A weakness in a shield of a coaxial cable can be discovered by inducing a reference test signal onto the coaxial shield, or sheath, and testing with a receiver for a resulting leakage signal on a center conductor inside the coaxial cable. The reference test signal may optimally be induced onto the cable by means of a magnetic coupling device. The magnetic coupling device can be assembled by creating a transformer with the cable's shield acting as a secondary winding, a few turns of wire connected to a reference test signal transmitter acting as a primary, and a ferrite core acting as the magnetic coupling device. The ferrite core can optionally be split for easy application around the coaxial cable. The advantage of this testing technique is that the reference test signal travels on the sheath of the coaxial cable to the break in the cable's sheath where it enters the center conductor, in an identical fashion to the mechanism by which power line conducted noise enters the center conductor. Power line conducted noise creates the most common form of return impairments.

Figure 2:
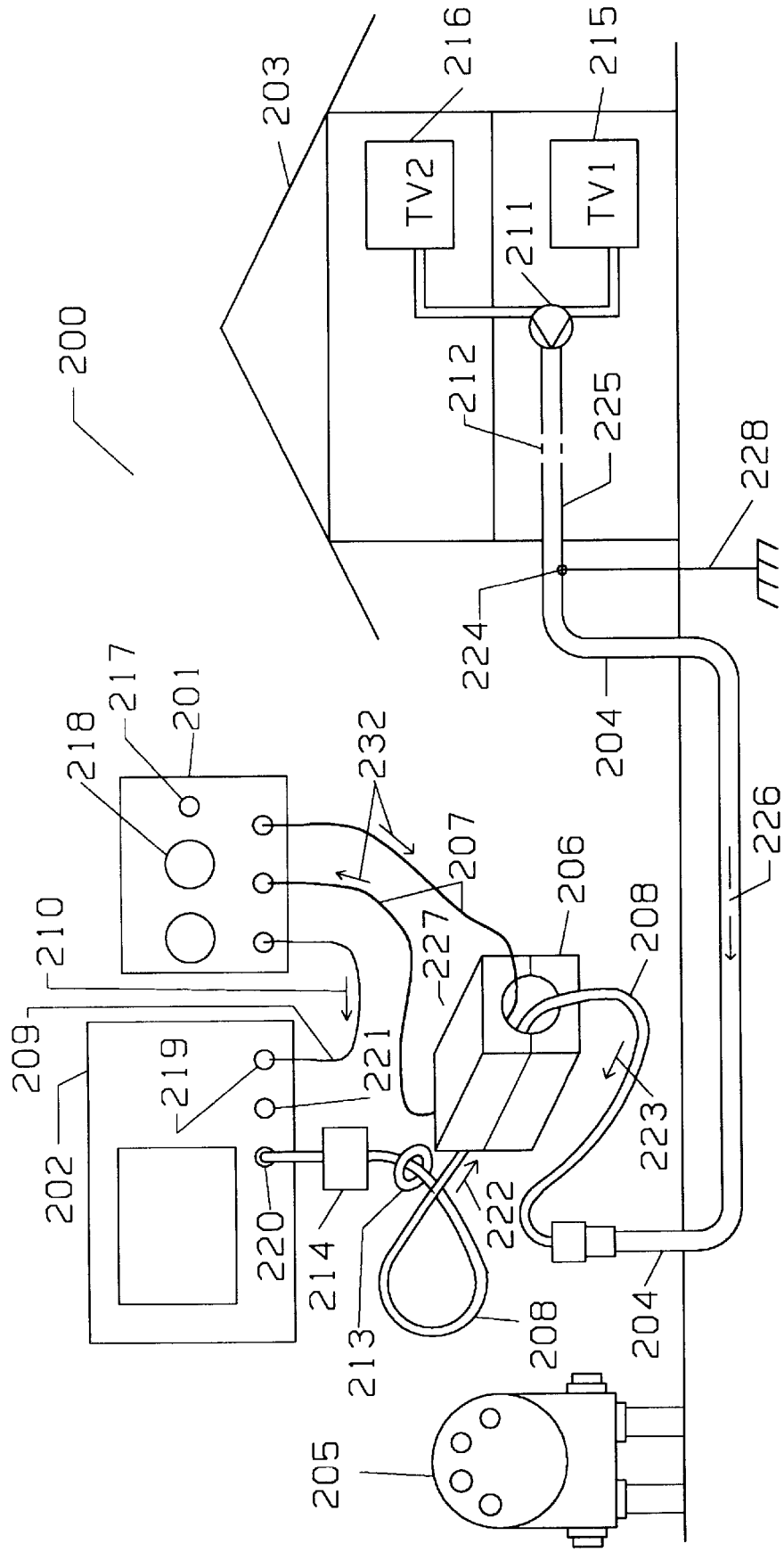
FIG. 2 is a block diagram of a test system that can be used to test a remote point for shielding effectiveness by detecting signals inside a coaxial cable at a remote point.

FIG. 2 is a diagram of how a test can be performed with both a reference test signal transmitter 201 and a receiver 202 at a remote point 200. The diagram illustrates a house 203 with a coaxial drop cable 204, and a coaxial cable indoor portion 225 having a shield break 212 inside the house. The house coaxial cable 225 typically connects to a drop cable 204 at a grounding block 224. The grounding block 224 is the normal point for grounding via a ground rod 228 or for connecting to the ground terminal in the electrical box. The drop cable 204 has been disconnected from the tap 205 and connected to the receiver 202 which may be a digital sampling receiver, such as the Tektronix TDS 220 digital oscilloscope. Alternately, a data acquisition card, such as a Gage CompuScope 250, that plugs into a personal computer (PC) is also a digital sampling receiver. A data acquisition module, such as can be purchased from Link Instruments as their part number DSO-2102, can also be used as a digital sampling receiver. Data acquisition cards and data acquisition modules typically can be purchased with software that allows the time domain trace to be viewed on a computer monitor. A split ferrite core, which can be obtained from Fair-Rite Products Corp. Wallkill, N.Y. aspart number 2643164151, is used as a magnetic coupling device 206. The magnetic coupling device forms a transformer 227, which contains a primary winding 207 and a secondary winding 208. The secondary winding 208 is a coaxial cable, which may be part of drop cable 204, or a coaxial extension added to the drop cable 204. The magnetic coupling device 206 is clamped around both the secondary winding 208 and primary winding 207. The drop cable, or an extension of the drop cable, forms a single turn secondary winding. The primary winding 207 contains at least 1 turn and is connected to a reference test signal transmitter 201 which generates a reference test signal 232. Optimally, the reference test signal transmitter 201 should generate a repeatable waveform and have consistently high energy at all test frequencies, such as 1–40 MHz. In a preferred embodiment, the reference signal transmitter can be made to transmit a pseudo-noise sequence for 20.48 microseconds with a clock rate of 50 megasamples per second using a pseudo-noise generator. Optionally, the reference signal transmitter also generates a burst trigger signal 210 for triggering the digital sampling receiver 202 by means of a trigger connection 209 that may be a wire to a trigger channel 219 on the digital sampling receiver. In a preferred embodiment, the burst trigger signal 210 is a 5 microsecond long transmission of a 25 MHz sine wave which precedes the start of the reference test signal by 2.5 microseconds.

If the reference test signal 232 is applied to the transformer primary winding 207, the reference test signal current will be induced on the secondary winding 208 in both directions as illustrated by a reference current arrow 222 on the left side of transformer 227 and a reference current arrow 223 on the right side of transformer 227. Depending on the type of reference test signal utilized, the current direction will alternate. The arrows are shown for reference. The reference test signal travels towards the house 203 on the sheath or outside of the coaxial drop cable 204 where it is divided when it hits a connection at the grounding block 224 or a splitter 211. If the signal on the sheath encounters the shield break 212 in the cable 225, a center conductor signal 226 will be induced into the center conductor of the coaxial cable 225. This center conductor signal 226 travels back towards the receiver 202 inside the drop cable 204, through the secondary winding 208 to the receiver 202. Receiver 202 is triggered and acquires the center conductor signal 226. Triggering may occur by detecting the presence of center conductor signal 226. Alternatively, in a preferred embodiment, triggering is accomplished by the burst trigger signal 210 through the trigger connection 209 which may be a trigger wire.

The launched reference test signal, illustrated by reference arrow 222, traveling towards the digital sampling receiver on the sheath of the coax 208 will not produce a trace on the digital sampling receiver if the digital sampling receiver has good shielding, but some of the signal will be reflected back towards the transformer 227. For this reason, it is desirable to have several meters of coaxial cable added to secondary winding 208 between the digital sampling receiver and the transformer 227, so that any reflected shield signal will be delayed relative to the launched signal shown by reference current arrow 223. The coaxial cable can optionally be passed through a second ferrite core 213 located near the receiver, to reduce the amount of reference test signal that reaches the digital sampling receiver on the sheath of coax 208. The coax can optionally be looped through the second ferrite core 213 a number of times to increase ferrite's effectiveness. Since ferrite core 213 is made from lossy material, it may also provide some reduction in the magnitude of the reflected pulse if it is carefully selected. A low pass filter 214 may be required before an input 220 to the digital sampling receiver to prevent aliasing, or the sampling of signals with frequencies over the Nyquist limit, in a manner well known in the art. If required, the low pass filter function can be built into the digital sampling receiver 202, or it can be built into the reference test signal transmitter 201.

If the coaxial wire 225 in the house 203 is good, there could still be a center conductor signal returned by a consumer electronic device with poor tuner isolation, such as televisions 215 and 216, a video cassette recorder (VCR), or other devices.

The returned center conductor signal inside the coaxial cable will not typically have a flat frequency response, relative to the launched reference test signal, for a number of reasons. Some of these reasons are the reflective nature of the signal path during the test, frequency selectivity of the television 215 tuner's isolation, the back reflected shield signal from the frame of the digital sampling receiver 202, or because of imperfect frequency response of the transformer 227. The wider the bandwidth of the launched reference test signal, the better the resolution will be for determining the time delay between the reference test signal's launch on the shield and the receipt of a center conductor signal. The first reflection's delay time may be used to calculate the cable length or electrical path length to the break. The calculation of distance from electrical delay time is ranging. If there are multiple breaks in coaxial wiring in the house, the first reflection can be most readily and accurately ranged. However, the total energy reflected, which is a test parameter of interest for comparative reasons, can also be measured.

Note that if the digital sampling receiver 202 does not provide an internal termination, one must be provided externally.

If there are several splitting devices in the house coaxial wiring, and the shield break is after one or more of the splits, the returned center conductor signal will have lower energy. The energy will be lower because less current is flowing over the defective portion of the coaxial cable as well as the combining losses for the returning signal inside the cable. This technique works to test a single family house. Thus the test signal should be injected near the source of the shield break 212 to accurately determine the presence of a shield break 212. For example, this technique should not be expected to accurately test the shield integrity to all rooms in a large hotel by launching a signal from outside the building, nor should this technique be used to test an entire node with 500 homes by launching a signal on the coaxial shield at the fiber node.

Once the center conductor signal 226 is captured by the receiver 202 using digital sampling, a number of operations can be done on the trace to provide useful information. First, the trace can be simply viewed by the technician for peak-to-peak voltage. There is a dramatic difference in the magnitude of a center conductor signal between a house with good shield integrity and a house with a severe shield break.

Second, the total power of the trace can be computed for comparison with a standard.

Third, the trace can be transformed into the frequency domain for examination and power spectral density measurement. The center conductor signal can be used for determining which frequencies are preferentially allowed into the coaxial cable. This data may be of interest if the consumer electronics devices allow signal from the shield into the center conductor, but not in the frequency bands where sensitive carriers are located. The frequency response of the returned center conductor signal may provide some information to an experienced technician about the nature of the shielding problem in the home. If the spectral density of the reference signal is flat, the magnitude of the frequency domain center conductor signal may be directly viewed.

The frequency response of the path between the reference test signal transmitter 201 and the receiver 202, may be found by digital signal processing. This is done by first storing an ideal or unimpaired reference test signal. Next, both the stored ideal reference signal and the received center conductor signal are converted into the frequency domain using the discrete Fourier transform. In the frequency domain the received center conductor's signal's coefficient is divided by the reference signal's coefficient, on a sample frequency by sample frequency basis. This is a division of two complex numbers. The resultant ratio is the frequency response, which is also a complex number having a magnitude and a phase. The derivative of the phase with respect to frequency is the group delay, which is the time difference between the reference test signal and the received center conductor signal. If desired, the frequency response can be transformed back into the time domain by use of the inverse discrete Fourier transform. The result of this operation is the system's impulse response.

Optionally, the imperfect frequency response of the transformer 227 can be removed from the frequency response calculation. This can be done by capturing and using a stored reference signal that has passed through the transformer 227. This is done by replacing secondary winding 208 by another secondary wire that is passed through magnetic coupling device 206. The new wire is connected on both ends directly to the input 220 on receiver 202 while a stored reference signal is being captured.

Alternatively, signal processing for time delay can also be done by performing a convolution in the time domain between the received center conductor signal and the stored reference signal.

Frequently, vendors of digital sampling receivers provide software to display voltage as a function of time on a monitor, to perform a Fourier transform and display it on a monitor, or to do a power measurement. Sometimes the software is built into the device as firmware, and sometimes it is a computer program.

The transmitted reference test signal may be of several types, each with different advantages for producing low interference with broadcast signals, accurately ranging distances, inexpensive to build, having an inexpensive companion receiving device, ease of signal processing for ranging data, and compatibility with carriage on cable return networks.

Possible reference signal sources are an impulse, a series of impulses forming a comb signal, a PN signal, a conventional continuous quadratic chirp, and an orthogonal frequency division multiplex (OFDM) signal, or a signal invented by David Koo. These signals are all repeatable from one transmission to the next.

A novel signal source that can be used is a frequency stepped quadratic chirp. This signal is made by increasing the frequency of a sine wave in multiple discrete frequency steps. Phase is held continuous as the frequency steps upward or downward. This signal can be generated by rapidly reprogramming a numerically controlled oscillator integrated circuit such as the Analog Devices AD9850. Alternatively, any of these signal sources can be stored in a read-only-memory in 8 bit digital form and played out into a high speed digital-to-analog converter in a manner well known in the art.

Continuous quadratic chirps and stepped quadratic chirps both have the advantage that the received waveform can be evaluated, as a time domain trace, for which frequencies preferentially leaked into the center conductor of the cable. This determination is made by observing the waveform magnitude versus time. This is possible with chirp signals since the frequency change is approximately linear with time. Other signals, such as PN signals and OFDM signals must first be transformed into the frequency domain by the discrete Fourier transform before a determination can be done about which frequencies leaked into the center conductor at a higher level.

Impulses are low in cost to generate and may be generated as a single impulse, a block of multiple impulses, or as a continuous train of impulses. A continuous train will produce the greatest interference with communications services by radiation from the sheath, but the receiver 202 can be an analog oscilloscope. If receiver 202 is a digital sampling oscilloscope it can be used to view a single impulse or a block of several impulses, which produce much less interference with broadcast signals than a continuous train of impulsive signals. Impulses have very large peaks for a small percentage of the total time. Impulses are not easy to transport on networks because they tend to clip or saturate active devices such as laser transmitters or radio frequency (RF) amplifiers. Impulses can be observed directly in the time domain for delay time, which can be used for ranging calculations without digital signal processing.

A short burst of a PN signal is also relatively inexpensive to generate and can also be used for purposes of distance ranging if digital signal processing is employed as described above. A PN sequence may need to be equalized to obtain a flat spectral density, since it normally has a spectral density that is a $\sin(x)/x$ function.

The reference test signal can be measured for total return energy for comparing homes to some standard. In field tests, an un-terminated coaxial cable with a shield cut at about 1 meter from the end was used as an arbitrary reference for comparison purposes.

Another device that can create a test signal with high energy over a wide frequency band is a piezo element from a barbecue lighter. Unfortunately this signal is not repeatable from one strike to the next and so can not easily be used for distance ranging. It can be used as an approximate indicator of returned energy if ranging is not needed.

Random or Gaussian noise can be used as a reference test signal. It has the property of a flat spectral power density, but it is not a repeatable signal.

Another technique for measuring cable shield breaks is to apply a broadband signal to the center conductor of the coaxial cable and measure with a transformer, similar to transformer 227, the signal that arrives back on the outside of the coax as a sheath current. The return signal detected on the outside of the shield will be mixed with broadcast signals. This alternate technique, which may be viewed as the present system except the transmitter and receiver are exchanged, may be useful. It offers the advantage of reduced interference with broadcast signals.

The proposed system for measuring signals inside the coaxial cable, in addition to typically providing a quiet connection, allows the measuring of signals and noise originating inside the house.

Figure 3:
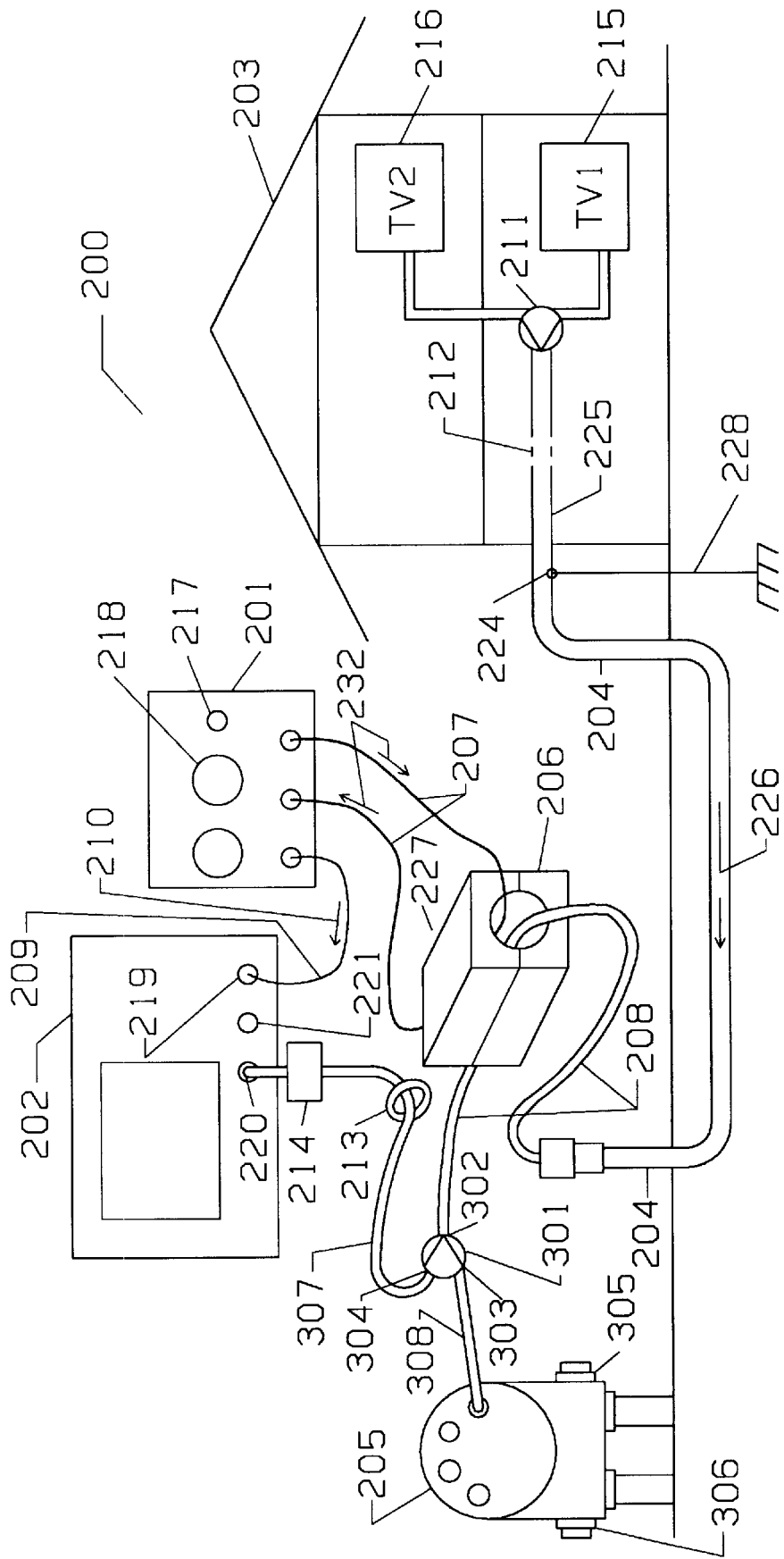
FIG. 3 is a block diagram of a test system that can be used to test the remote point for shielding effectiveness by detecting signals inside the coaxial cable at the remote point while providing less interruption to cable services.

The test system of FIG. 2 can be modified slightly to generate less disconnection time from the cable service. The disconnection time will only be the time it takes the technician to swap wires, not the time that it takes to perform the test, which typically takes longer. This test system is illustrated in FIG. 3. A directional coupler 301 and a first directional coupler connection 308 have been inserted between the tap 205 and the drop cable 204 or secondary winding 208 as illustrated. A second directional coupler connection 307 connects the other output of directional coupler 301 to the receiver 202 through optional low pass filter 214. This test system has the advantage of allowing the subscribers to continue viewing television with about 4 dB less signal while the test is being performed. Additionally, the directionality feature of the directional coupler 301 can be used to advantage to detect reference test signals that may have come from breaks in the hard-line coaxial cable. This determination is made by swapping terminals 302 and 303 on directional coupler 301. Terminal 304 remains connected to the second directional coupler connection 307 while terminals 302 and 303 are swapped. If the center conductor signal being received came from the house 203, swapping the leads should result in less received center conductor signal 226.

The above described testing techniques illustrated in FIGS. 2 and 3 are definitive tests for shield breaks and should be employed by installers and technicians when doing new installations and when troubleshooting.

The test systems illustrated in FIGS. 2 and 3 have a major disadvantage in some circumstances: it requires disconnecting the drop cable 204 from the tap 205 or from the ground block 224. This may not be possible if a critical service, such as a telephone conversation, is being carried through the connection. These two test systems have another problem: if the shield break is caused by a corroded connection between the drop cable 204 and the tap 205, unscrewing the connection may fix the problem, perhaps only temporarily.

Figure 3A:
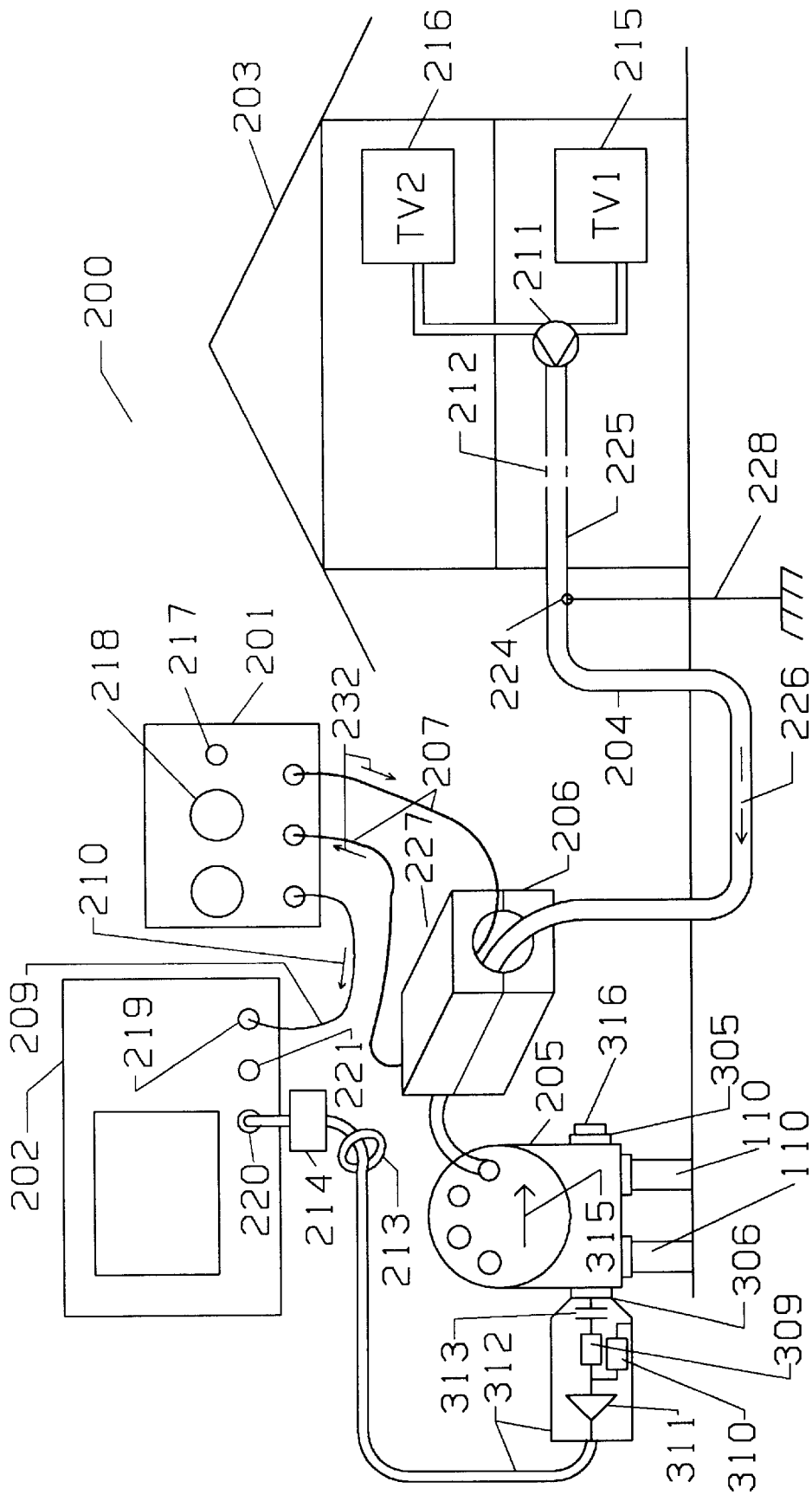
FIG. 3A is a block diagram of a test system that can be used to test the remote point for shielding effectiveness by detecting signals inside the coaxial cable at the remote point while providing no interruption to cable services.

FIG. 3A illustrates a test system that tests without disconnecting the subscriber's drop cable 204 from the tap 205. The technician can measure signal inside the tap by removing a plug from an access port 306 and measuring the signal level on the center conductor of the hard line coax 110 by probing the seizure screw located under the plug. The plug is similar to a plug 316 located on the opposite side of the tap 205. A high impedance probe 312 should be used to avoid creating an impedance mismatch or reflection on the hard line coaxial cable 110. The high impedance probe 312 consists of a bypass capacitor 313, which may have a value of 0.05 microfarad, a series resistor 309, which may have a value of 1000 ohms, a shunt resistor 310, which may have a value of 82 ohms, and an IC amplifier 311 which may utilize one or more integrated circuits such as the Hewlett Packard MSA0304 to boost the signal level for application to the low pass filter 214. The high impedance probe may be temporarily screwed into the tap 205 in place of the plug. Since the amplifier 311 requires power, DC power can be provided by a battery inside the high impedance probe 312. Alternatively, a field-effect transistor amplifier (FET) can be used. FET high impedance probes are available commercially, but are not made rugged enough for outdoor testing. The high impedance probe includes a cable to connect it to receiver 202.

If the ingress signal came from house 203, the center conductor signal voltage will be lower by this probe technique than the result obtained by the technique illustrated in FIG. 2. The level will be lower by the additional value of the tap minus 4 decibels. Tap values typically range between 4 and 32 dB. If the shield integrity problem is on the hard line, the signal level will be stronger by this technique. Tap arrow 315 indicates the direction of the forward signal through the tap.

This test technique can also be used if the technician suspects the shield break problem is not with any of the homes connected to the tap. Because of the directionality property of the tap 205, if the center conductor signal found on an access port 305 is approximately the same strength as the signal found on the access port 306, signal from the shield break is probably not coming from any of the 4 ports on tap 205. Thus, the directional properties of the tap 205 can be used to good advantage to help diagnose the shield break problem.

Another modification to the test system of FIG. 2 is to put an additional third sense winding on the magnetic coupling device 206 and apply the signal from this winding to a digital sampling receiver's second channel 221 on digital sampling receiver 202. When the reference test signal is transmitted, second channel 221 is used to capture and record a trace of the reference test signal current, as illustrated by current arrows 222 and 223, that was actually transmitted. This recorded reference signal burst may be used as the reference test signal in place of the stored reference signal for increased accuracy. This testing technique modification allows ranging with reference signals that are not repeatable on each transmission, such as random noise. In essence, second channel 221 captures a new stored reference signal with each reference test signal transmission. Alternatively, the sense winding can be placed on a third ferrite core placed on the drop cable 204 near transformer 227, forming a second transformer that shares the same secondary winding 204.

DESCRIPTION—FIG. 4

Figure 4:
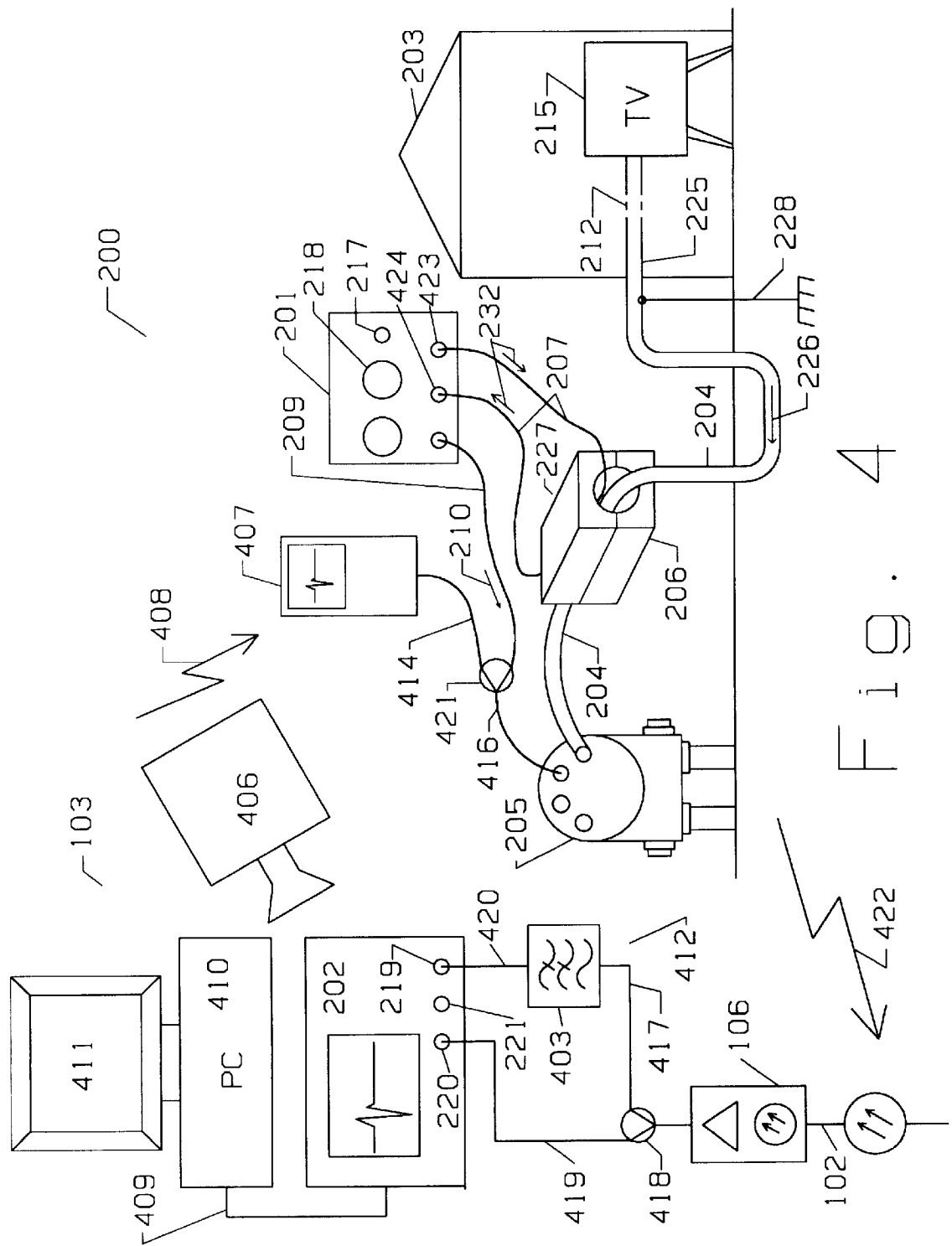
FIG. 4 is a block diagram of a test system that can be used to test the remote point for shielding effectiveness by detecting signals inside the cable at a headend or a distribution hub.

Another test method that does not require the access ports 305 or 306 to be opened, and does not require the home's drop cable 204 to be disconnected from the tap 205 is disclosed in FIG. 4. The center conductor signal 226 from the shield break 212 is detected back at the headend 103, and the test results are relayed back to the technician at the remote point 200 via a downstream results signal 408. The digital sampling receiver 202 back at the headend 103 is triggered over a return path 422 by the burst trigger signal 210, which may be a short transmission of a sine wave. The return path 422 is illustrated as a broken arrow. The transformer's ferrite material in magnetic coupling device 206 encircles the drop cable 204 which remains connected to the tap 205. A burst trigger signal 210, which may be a 25 MHz sine wave through trigger connection 209 from reference test signal transmitter 201, is launched back towards the headend through an optional directional coupler 421 into a spare port on the tap 205. The return signal is passed over return fiber optic cable 102 and received by the upstream laser receiver 106. Back at the headend 103, a splitter 418 splits the return signal and applies a portion directly to the digital sampling receiver 202 by a lead 419 and a portion to a burst band pass filter 403 by a lead 417. The burst trigger signal passing through the band pass filter 403 is applied to trigger channel 219 on receiver 202 via a lead 420 and triggers the digital sampling receiver 202. The band pass filter 403 serves to prevent noise or other return signals from prematurely triggering the digital sampling receiver 202. Bandpass filter 403 forms one type of a remote trigger signal identifier 412. Many other types are also possible. Receiver 202, via input 220, is acting as a receiver for all return band energy from fiber node 104. The stored trace on the digital sampling receiver's display can be viewed out in the field by pointing a television camera 406 at the digital sampling receiver's display screen. The television camera 406 has its video output connected to a modulator running in a spare 6 MHz wide downstream channel. The modulator, which may be a Scientific Atlanta model 6350, sends as visual image of the test results back into the field for viewing by the technician on a field output device 407, which may be a portable TV with video and audio channels in a manner well known in the art. This downstream results signal 408 is symbolically illustrated by a broken line. A field output device TV 407 is tuned to the spare TV channel. Another method which is commonly used to relay test results or data into the field is to use a transmitter/receiver pair employing a frequency shift keying (FSK) carrier. Directional coupler 421 allows a tap connection 416 to be shared with the burst triggers signal 210 and the field viewing device.

Alternately, the time domain signal may be extracted from the digital sampling receiver. If the digital sampling receiver is an oscilloscope, data may be extracted over a general purpose instrumentation bus (GPIB) cable 409 and transformed into the frequency domain data by PC 410 for display by a monitor 411. If the digital sampling receiver is a data acquisition card, the data may be extracted over the bus of the PC. If the digital sampling receiver is a module, the data may be extracted over a parallel printer cable.

Alternatively, the PC can be used to compute the frequency response by comparing the received signal with a stored reference signal. The frequency response can be further processed for group delay data. If the PC monitor uses the VGA video standard, a VGA to NTSC converter can be used in place of the television camera 406.

The reference test signal transmitter 201 generates the burst trigger signal 210 followed by the reference test signal 232 when a transmit signal button 217 is pressed. If the shield integrity in the field is good, only a trigger signal will be received when the test is performed.

The delay through the band pass filter 403 should be known since it will need to be backed out of the calculations for distance ranging. Note that when doing this test, if the coaxial sheath break is towards the fiber node, there will be very little delay difference between the burst trigger 210 and the arrival of the center conductor signal. If the sheath break is further away from the fiber node than the burst trigger signal injection point, there will be a larger delay. The velocity of propagation inside conventional dielectric foam coaxial cable is about 82% of the speed of light. Accurate ranging requires accurate timing information from the remote trigger signal identifier.

If a home is found to have a shield break, the shield break should be repaired. If it can not be repaired, the cable upstream network can still be protected from noise originating in that home's coaxial cable by installing a high pass filter with a cutoff frequency that passes only the downstream band. This high pass filter is typically installed at the tap 205.

Another unrelated but important test that can be performed on the bi-directional cable system 100, while the technician is at the remote point 200, is to test the frequency response and group delay of the return plant back to the headend. This is done by connecting terminals 423 and 424 on the reference test signal transmitter 201 directly to a tap port on the tap 205 and launching a burst trigger signal 210 followed by a burst reference test signal 232 from terminals 423 and 424. The burst trigger signal 210 and reference signal 232 can be the same signals used to perform the shield break test as illustrated in FIGS. 2, 3 and 3A, and 4, except the reference test signal transmit level needs to be reduced with an attenuator 218 to prevent overloading the active elements in the return path. At the headend, the burst trigger signal triggers remote trigger signal identifier 412 which triggers the digital sampling receiver 202. The receiver 202 then captures the received test signal, and downloads it into the personal computer 410. The personal computer analyzes the captured reference test signal with a stored reference test signal for frequency response and group delay. This test allows the return plant to be analyzed for the presence of echoes, or multi-path distortion, as well as excessive group delay or amplitude non-flatness. The results of this test are visible on monitor 411 or from field output device 407 at remote point 200. Thus, a frequency response and group delay test can use the test equipment and test method of FIG. 4 with the exception that the reference test signal is applied directly to a tap port on tap 205 at a lower signal level than would be applied to the magnetic coupling device 206.

DESCRIPTION—FIGS. 5–7

Figure 5:
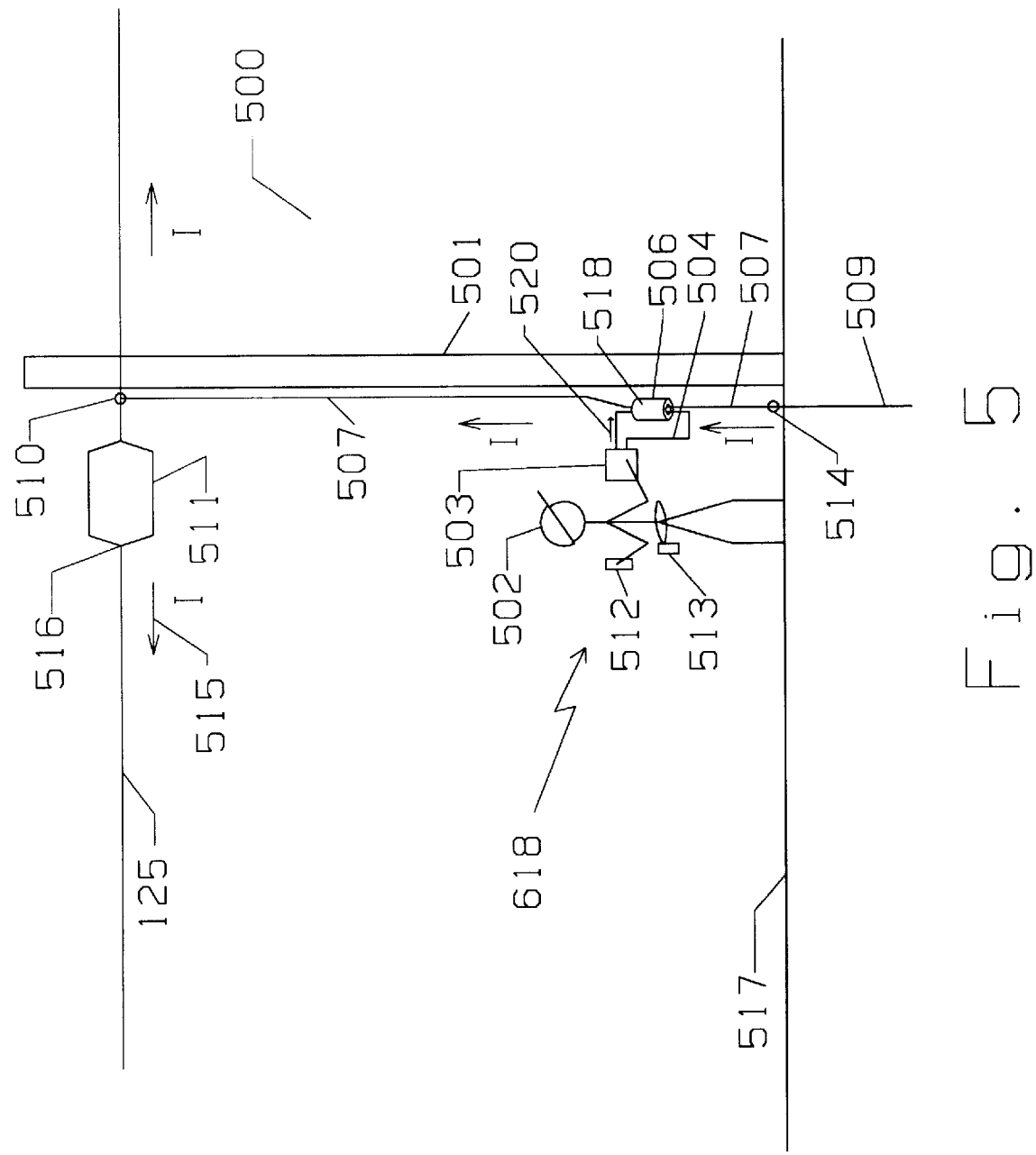
FIG. 5 is a block diagram of a test system that can be used to test a cable system for shield integrity by indirectly inducing current into a sheath.

FIG. 5 illustrates a test method at a test site 500 that can be used to test the plant for breaks in the shield without climbing a utility pole, such as 501, by indirectly injecting current into the sheath. A technician 502 carries a triggerless reference test signal transmitter 503. Triggerless reference test signal transmitter 503 applies a triggerless reference test signal 520 to a primary winding 504, which passes through the hole in a split large ferrite core 506. The split large ferrite core 506 acts as a magnetic coupling device. A ground wire 507 which connects the coaxial cable plant 125 to earth via a ground rod 509, forms a secondary winding on a transformer 518. Ground wires are used to ground coaxial cable plant to earth at many poles, depending on local practice. The ground wire 507 may optionally be used as a ground connection by the power utility wires which, if on the same pole, are physically located above the cable lines. The current from triggerless reference test signal 520 is directed up into the coaxial cable plant 125 and split at the bonding point 510. If the injected current finds its way into a break in the shield such as a cracked fitting at a location 516, some of the center conductor current will travel back to the headend 103 where it can be detected by a receiver.

If desired, the technician 502 can climb the pole 501 and apply the transformer 518 directly around a coaxial cable on the coaxial cable plant 125. That is, the transformer secondary would be the coaxial cable, instead of the ground wire 507. This test method would give a more accurate test result, but takes longer.

This triggerless reference test signal injection method can be modified by two methods. One is to clamp the ferrite core around the ground wire, and cut primary winding 504 into two pieces. One end of severed winding 504 connects directly to the ground wire 507 just above the split large ferrite core 506, and the other end of severed winding 504 connects directly to the ground wire 507 just below the split large ferrite core 506. If the ferrite core is perfect and provides a high impedance at all frequencies, the transmitted triggerless reference test signal 520 should be the same by either method. In practice, the transmitted triggerless reference test signals will be approximately the same.

The second modification to the test method is to apply one end of severed winding 504 to the ground wire 507 and apply the other end of severed winding 504 to another ground point not directly attached to the ground point 514. The split large ferrite core 506 is not used. This method is less practical because obtaining a second good quality ground separated from the ground rod 509 may not always be possible.

This method of testing is more difficult because the center conductor signal from a shield break must be received back at the headend 103 without the benefit of a distinctive triggering signal, such as the burst trigger signal 210 generated through the trigger connection 209. Furthermore, the reference test signal could have been selectively filtered by the shield break or by other means. A "triggerless receiver" is needed to automatically scan the return frequency spectrum for components of the triggerless reference test signal 520 at different frequencies. A reference test signal that has energy at all test frequencies and can be detected without the benefit of a burst trigger signal has been referred to as the "triggerless reference test signal" 520. One signal that can be used as a triggerless reference test signal 520 is a comb signal. As is well known in the art, a comb of impulses in the time domain may be observed to be a comb of discrete carriers in the frequency domain. If a comb is generated with impulses every 1 microsecond, the signal will consist of sine waves with harmonics at 1, 2, 3, . . . MHz. The harmonics can be detected back at the headend 103. It is important to limit the duration of the test to a short time period to avoid interference with broadcast communications services. The comb should be low pass filtered to limit energy outside of the return test frequency band. It is also important to limit the power of the triggerless reference test signal 520 to minimize interference. For this reason, it is desirable to have a sensitive receiver that can quickly detect the triggerless reference test signal 520 on the center conductor.

A receiver can be placed in the headend to detect the presence of one or more of the center conductor signal's harmonic carriers. If there is a shield break, some of the harmonics of the triggerless reference test signal 520 may land on carriers for upstream services, and other ingress sources may have energy at the harmonic carriers' frequencies. Thus there is a need to accurately measure the triggerless reference test signal 520 in the presence of background noise. Several types of receivers can be used to detect one or more of the harmonics of the comb. The most straightforward approach is to use a scanning receiver with a synthesized phase locked loop local oscillator to hop between harmonics to measure the strength of each carrier. A second more expensive approach would be to use a spectrum analyzer such as the Hewlett Packard 8591 with a general purpose instrumentation bus (GPIB) connection back to a PC with a GPIB card. The computer could receive the sweep data of the spectrum analyzer and analyze the trace for harmonics of 1 MHz. Another triggerless receiver approach would be to utilize a very high speed analog to digital (A-D) converter operating at 100 megasamples per second followed by a digital filter. The digital filter could be programmed to respond to the impulses or harmonics of the impulses while rejecting other signals and noise.

Figure 6:
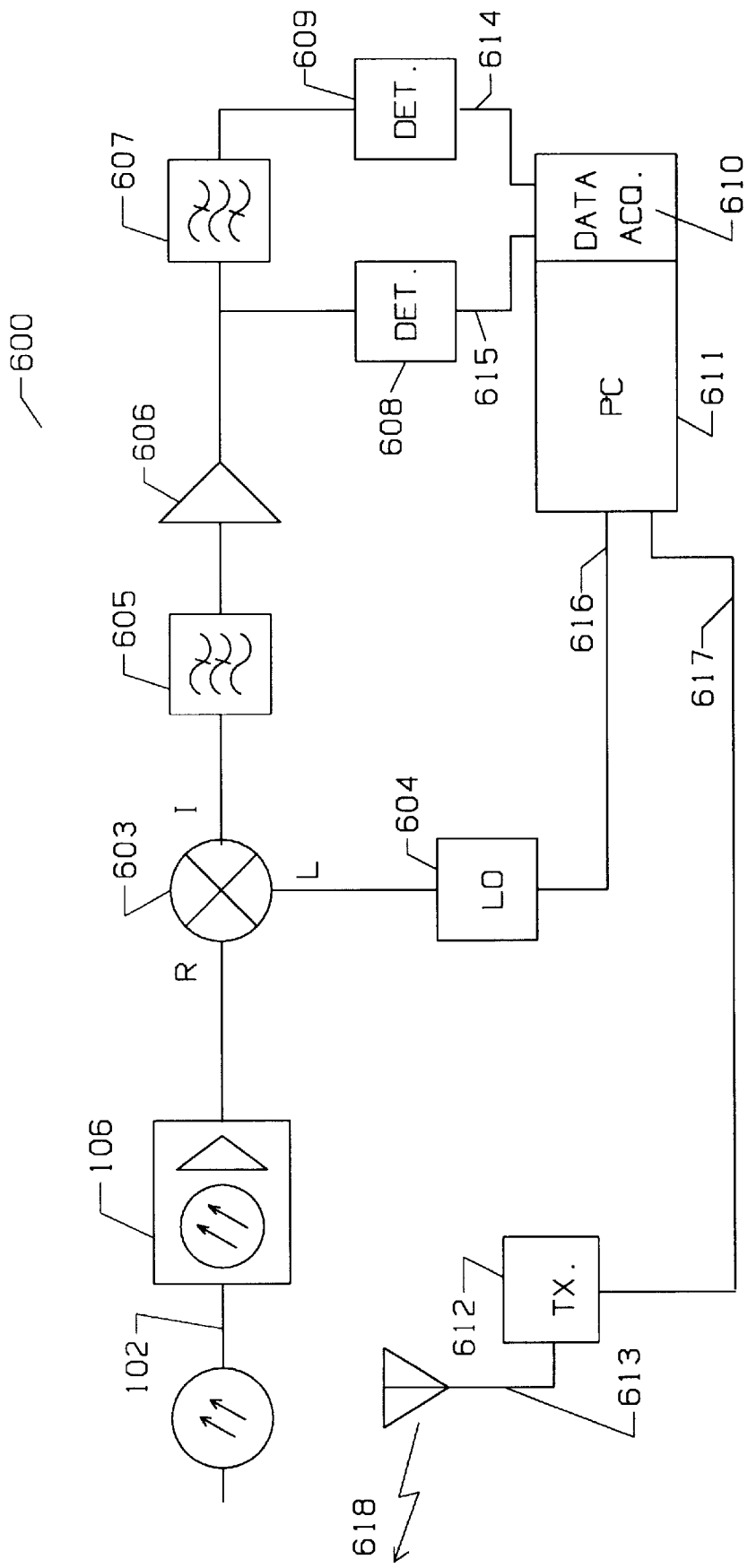
FIG. 6 is a block diagram of a headend receiver system that can be used to determine if a test signal applied by the test system of FIG. 5 has ingressed into the coaxial cable plant at a shield break.

A receiving system with the needed characteristics is illustrated in FIG. 6. A receiver system 600 receives an upstream center conductor signal from the node 104 via the fiber optic cable 102. The optical signal is converted to an electrical signal by the upstream laser receiver 106 and applied to a mixer 603. The upstream laser receiver 106 should limit its output energy to the 5–40 MHz band. If it does not, a 5–40 MHz band pass filter should be provided after the upstream laser receiver 106. The mixer 603, which may be a Mini Circuits model SBL-1, is driven by a local oscillator 604. The local oscillator is a numerically controlled oscillator (NCO) which employs direct digital synthesis, such as is available from Analog Devices in evaluation board form as their part number AD8950/FSPCB. A NCO allows faster and more accurate frequency hopping than a conventional phase-locked loop synthesizer, and produces a high quality sine wave with lower phase noise. The NCO is programmed to frequency hop to frequencies offset from the harmonics of the triggerless reference test signal 520 by a small difference frequency such as 10 kHz. Thus, the NCO would step between frequencies such as 5.01, 6.01 7.01 . . . MHz. The mixer 603 will produce a beat frequency with any harmonic present in a manner well know in the art. The beat, or difference, frequency is passed through a low pass filter 605 with a cutoff frequency that may be 15 kHz The low pass filter rejects energy that is more than + or −15 kHz from the NCO's frequency. An amplifier 606 which may be an integrated IC operational amplifier such as the OP-27, which is available from Precision Monolithics, boosts the level of the low frequency signal from the low pass filter. A band pass filter 607 has a center frequency of 10 kHz to pass the beat frequency. The bandwidth of band pass filter 607 is set wide enough to allow for the expected frequency drift difference between the NCO and the triggerless reference test signal transmitter 503, which will be greatest on the harmonics at the high end of the upstream frequency band. A filtering detector 608 detects all the energy passing through amplifier 606, while a filtering detector 609 detects only energy coming through the 10 kHz band pass filter 607.

Note that this receiving method will detect the carriers at −10 kHz offset from the local oscillator 604 as well as the image frequency at a +10 kHz offset. This can be remedied for a 3 dB improvement, if desired, with a more complicated circuit using a Hilbert transformer. A wideband filtered detector output 615 and a narrowband filtered detector output 614 are passed into a data acquisition card 610 which may be obtained from National Instruments as their part number PC-LPM-16. The data acquisition card is plugged into a PC 611 which receives the digital data from both inputs on the data acquisition card. A computer program with flow diagram 700, running on the PC extracts data from the data acquisition card 610 to determine if the energy through band pass filter 607, indicated as a direct current (DC) voltage on narrowband filtered detector output 614, is clearly above the noise floor indicated on wideband filtered detector output 615, which is also a DC voltage. After the determination is made, PC 611 commands the LO 604 to jump to the next harmonic via a parallel printer port cable 616 and the test is repeated. A test of the upstream 5 to 40 MHz band in 1 MHz increments requires 35 frequency hops. If several harmonics are detected, or if several new frequencies are suddenly observed to be distinguishable above the noise floor, the personal computer program flow diagram 700 orders an ingress detection transmitter, 612, to send an alarm ingress detection signal 618 via an antenna 613 and a personal receiver 513 to the technician 502 performing the test. The personal receiver 513 may be a 2-way radio, a cellular phone call, or a pager. The alarm signal may have additional data, such as which frequencies failed and the received ingress harmonic levels. The transmit time for the triggerless reference test signal 520 should be slightly longer than the PC requires to step through all 35 frequencies.

Figure 7:
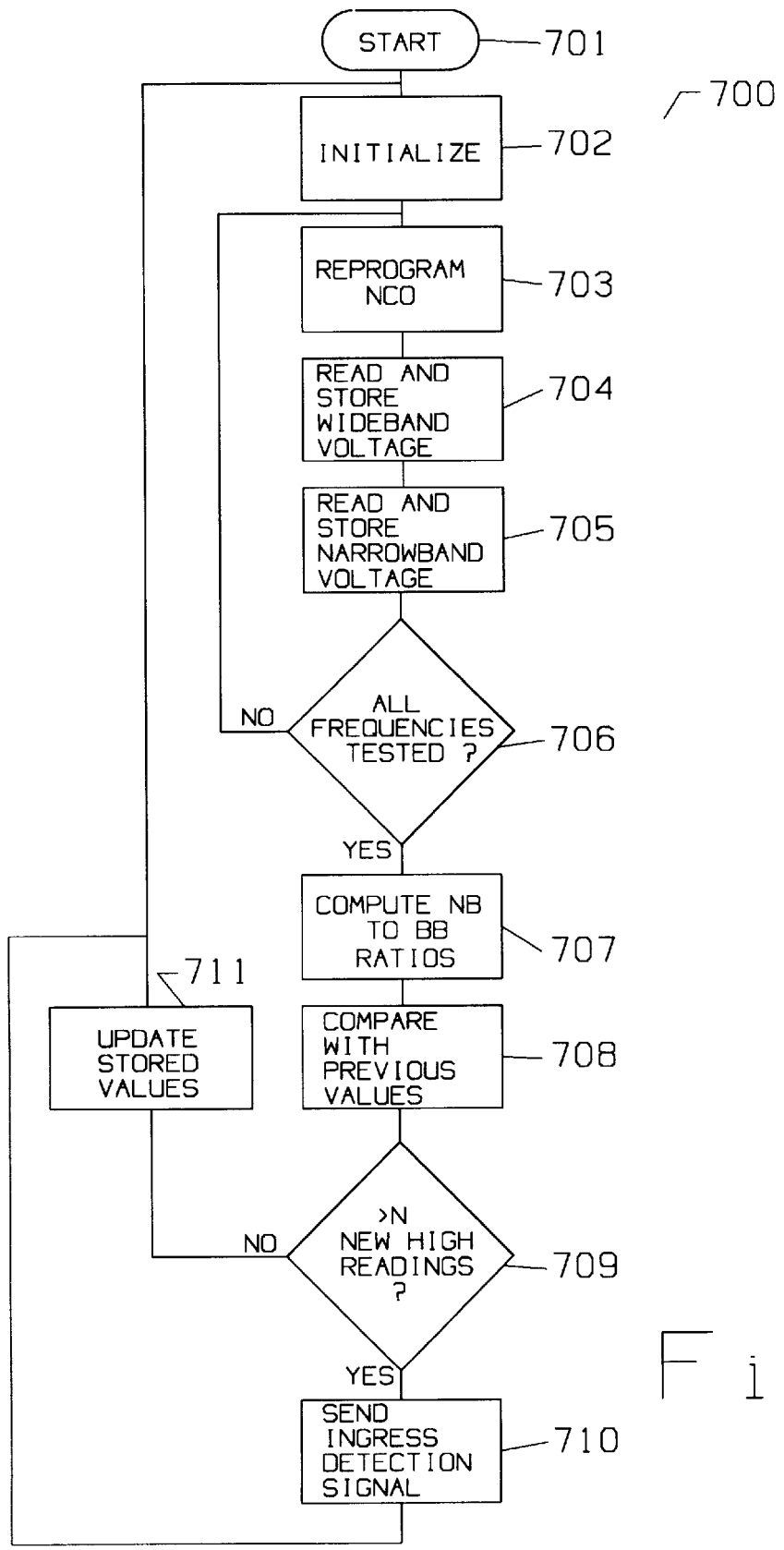
FIG. 7 is a software flow diagram for the headend receiver system.

FIG. 7 is a flow diagram 700 of the software running on the personal computer. At step 701 the program is started. At step 702, the system is initialized. At step 703 the NCO is programmed with a frequency. At step 704 the wideband DC voltage is read on wideband filtered detector output 615 and stored. At step 705 the narrow band DC voltage is read on narrowband filtered detector output 614 and stored. At step 706 the program checks whether or not all frequencies have been tested. If not, the program branches to step 703 and the measurements are repeated at a new frequency. If yes, processing continues to step 707 where the ratios of broadband to narrow band voltages is computed for each frequency. Next, at step 708 the ratios for each frequency are compared with previous ratios. At step 709 a decision is made whether more than N frequencies are above some threshold, such as a 20% increase. N may be a programmable number. If yes, an ingress detection signal is transmitted at step 710. If not the readings are stored in the data base at step 711. In either case, processing resumes at step 702.

The technician 502 in the field can also be carrying a global position sensing (GPS) receiver 512 that can be queried for test location,. The coordinate position data where the test was done can be stored for later analysis.

If the GPS receiver's coordinates are placed into a storage device, such as a laptop computer, when an ingress detection signal 618 is received from the headend, the technician need not be bothered with writing down GPS coordinates. This allows the test to be done automatically, with less chance of errors and with less highly trained personnel. The data can ideally be processed to estimate the probable location of a shield break after all of the data is collected. The technician need not be made aware that a strong center conductor signal was received at the headend while he/she is doing the test. Optionally the reference test comb signal can be further refined to make its carriers more easily distinguishable from other signals and noise by gating the comb on and off at a rate such as 1 kHz. This would have the effect of slowing the test, but increasing its accuracy by making the harmonics more distinguishable from noise.

Another refinement to the signal that could be used to make the carriers more distinguishable from noise is to transmit a reference signal which is a comb of direct sequence spread spectrum signals. This signal can be created by performing very high speed sampling on a baseband low speed PN signal. The sampling process, with very narrow sampling pulses at a 1 microsecond repetition rate, produces a repeat spectra with an identical spread spectrum signal centered around each 1 MHz frequency increment. The advantage of this system is that the signals can be detected when they are below the background noise level, and there is low interference with broadcast services. The disadvantage is that the acquisition time for each carrier is slow, so the test takes longer. The receiving spread spectrum hardware is somewhat more expensive and complicated. Spread spectrum receiver technology is discussed in detail in "Principles of Communications Systems", Chapter 17, by Taub and Schilling, and is hereby incorporated as a reference.

DESCRIPTION—FIG. 8

Figure 8A:
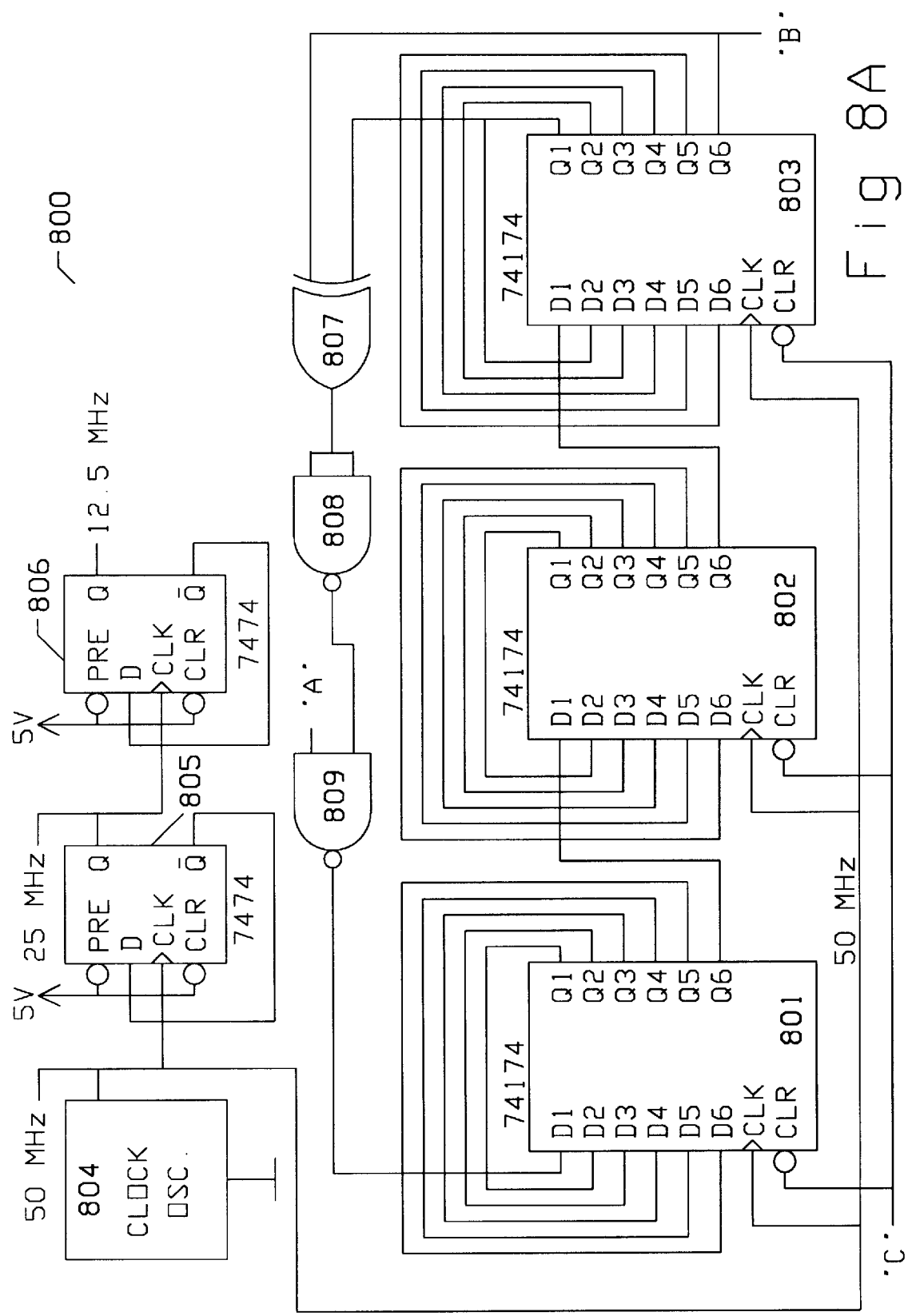
FIG. 8 is a schematic diagram of a circuit that generates a pseudo noise (PN) sequence and a burst trigger signal for use in a reference test signal transmitter.

FIG. 8 is a schematic diagram of a circuit that generates a PN sequence for use as the reference test signal 232, and a burst trigger signal 210 for use in a reference test signal transmitter 201. A clock oscillator 804 generates a 50 MHz square wave which is divided by 2 by a flip-flop 805 to make a 25 MHz clock and divided by 2 again by a flip-flop 806 to make a 12.5 MHz clock. A shift register chain 801–803, along with an exclusive "or" gate 807, an "and" gate 808, and an "and" gate 809 make a $2^{18}-1$ state pseudo noise generator. A counter chain 810–812 make a binary counter that provides timing for the start and stop times of the burst trigger signal and the PN sequence. The incrementing counter values make a 1-of-16 decoder 813 produce outputs that first make a Q output on flip-flop 814 go high for 5 microseconds, followed by a period of 2.5 microseconds with no output, followed by 20.48 microseconds while the Q output of a flip-flop 815 go high. An "and" gate 816 passes the 25 MHz clock out for 5 microseconds, and an "and" gate 817 passes the PN sequence out for 20.48 microseconds. One half of a bus driver 819 drives a 25 MHz burst trigger signal output 821 and the other half of the bus driver 819 drives a PN sequence output 820. A flip-flop 822 serves as a latch to keep the counter chain running until the sequence is finished. A flip-flop 818 serves as debouncer for transmit signal button 217. Outputs from this board are amplified, equalized and low pass filtered in a conventional fashion to provide an input to trigger connection 209 for the burst trigger signal 210 and connections for primary winding 207 via terminals 423 and 424. The integrated circuits can be built from the 74HC product line, and the circuit is very inexpensive to build.

SUMMARY, RAMIFICATIONS, AND SCOPE

Although the description above contains many specificities, these should not be construed as limiting the scope of the invention but as merely providing illustrations of some of the presently preferred embodiments of this invention. For example, a conventional network analyzer may be used in place of a reference test signal transmitter 201 and receiver 202 if the reference test signal transmitter 201 and receiver 202 are both in the same location, as illustrated in FIG. 2. Likewise, the above described test method can be incorporated as part of a cable status monitoring system to automatically perform the test periodically, or only when ingress is detected. If this system is deployed, a number of remote reference test signal transmitters 201 and transformers 207 will be permanently or temporarily mounted at several remote locations. The transmit signal button 217 may be operated by the status monitoring system.

The burst trigger signal 210 may be chosen from many different signals that can be easily, quickly, and securely recognized in the presence of high noise. For example, a two carrier system, similar to the two tone system used for telephone signaling, could provide a secure and fast detection signal. The burst trigger signal could be carriers at both 18 and 25 MHz. A two carrier burst trigger signal could also be used to implement a system that allowed multiple technicians to test at the same time in the same fiber node without confusing which results belong to which technician. This can be accomplished if different technicians use different pairs of carrier frequencies.

The ferrite material making up the core of the transformer can be non-split, as desired. A non-split core would require that the connection be broken to perform the test, but the results would be more consistent since there would be no inaccuracy in the launched reference test signal because of a variable air gap due to dirt or other foreign material between the core halves.

The core of the transformer can be made of a magnetic material other than ferrite that has good high frequency properties, such as powdered iron or a tape-wound core.

Another refinement is to combine the functional pieces at the test site 500 or remote point 200 wherever possible to increase utility and ease of use. For example, reference test signal transmitter 201, receiver 202, and transformer 227 can be incorporated into the same hand-held unit. Likewise the triggerless reference signal transmitter 503, the split large ferrite core 506, the GPS receiver 512 and the personal receiver 513 can be combined.

Thus the scope of the invention should be determined by the appended claims and their legal equivalents, rather than by the examples given.

What I claim is:

1. A test system for finding a break in a shield of a coaxial cable, the test system comprising:
    a transmitter having an output that supplies a reference test signal;
    a transformer for magnetically inducing the reference test signal onto the shield of the coaxial cable comprising
        a primary winding connected to the output of the transmitter;
        a secondary winding comprising a portion of the shield of the coaxial cable; and
        a magnetic coupling device for magnetically coupling the primary and secondary windings; and
    a receiver connected to a center conductor of the coaxial cable, for receiving a signal induced from the shield to the center conductor, and for indicating when the magnitude of the induced signal received exceeds the magnitude of the induced signal received from an unbroken coaxial cable, thereby indicating a shield break is present in the coaxial cable.

2. The test system of claim 1 wherein the reference test signal has energy at a plurality of frequencies.

3. The test system of claim 2 wherein the reference test signal comprises pseudo-noise.

4. The test system of claim 2 wherein the reference test signal comprises digital data retrieved from a memory and converted to an analog form.

5. The test system of claim 1 wherein the reference test signal comprises an impulse.

6. The test system of claim 1 wherein the coaxial cable comprises a cable plant.

7. The test system of claim 1 further comprising
    a tap located in the coaxial cable;
    a high impedance probe connected between the tap and the receiver.

8. The test system of claim 1 further comprising
    a directional coupler, having a directional coupler input terminal, a first directional coupler output terminal, and a second directional coupler output terminal;
    a tap;
wherein the coaxial cable is connected to the directional coupler input terminal and the tap is connected to the first directional coupler output terminal and the receiver is connected to the second directional coupler output terminal.

9. The test system of claim 1 wherein the receiver is a digital sampling receiver.

10. The test system of claim 9 wherein the received signal is processed by a Fourier transform method to determine which frequencies of the reference test signal are preferentially leaked into the shield break.

11. The test system of claim 1 further comprising
    a burst trigger signal created by the transmitter; and
    a trigger connection connecting the burst trigger signal from the transmitter to the receiver, wherein the receiver is triggered by the burst trigger signal.

12. The test system of claim 11 wherein the transmitted signal and the received signal are processed to determine the delay time between the transmitted signal and the received signal wherein the delay time indicates the location of the shield break.

13. The test system of claim 11 further comprising:
    a return path between the transmitter and a headend of the coaxial cable; and
    a remote trigger signal identifier connected to the headend and connected to a trigger input of the receiver to trigger the receiver when the remote trigger signal identifier receives the burst trigger signal over the return path.

14. The test system of claim 13 further comprising
    a field output device located adjacent to the transmitter; and
    a modulator for capturing an output of the receiver and sending the captured output to the field output device whereby the results of the shield break test are relayed to a location of the transmitter.

15. The test system of claim 1 wherein the transmitter output and the receiver connection are exchanged.

16. A test system for finding a shield break in a coaxial cable plant, comprising:
    a triggerless reference test signal transmitter having an output that supplies a triggerless reference test signal;
    a transformer for magnetically inducing the triggerless reference test signal onto a portion of the shield of the coaxial cable plant comprising
        a primary winding connected to the triggerless reference test signal transmitter output;
        a secondary winding which is electrically attached to the coaxial cable plant; and
        a split ferrite core which magnetically couples the primary and secondary windings; and
    a triggerless receiver connected to a return path of the cable plant;
whereby the triggerless reference test signal transmitter transmits the triggerless reference test signal and the triggerless receiver receives a return path signal when there is a break in the shield of the coaxial cable plant.

17. The test system of claim 16 wherein the triggerless reference test signal comprises a comb signal.

18. The test system of claim 16 wherein the triggerless reference test signal comprises a pseudonoise signal.

19. The test system of claim 16 wherein an ingress alarm detection signal is sent to the location of the triggerless reference test signal transmitter when the triggerless receiver receives a return path signal.

20. The test system of claim 16 wherein the triggerless reference test signal is indirectly induced onto the shield.

21. A method for identifying a shield break in a coaxial cable plant comprising the steps of:
    (a) magnetically coupling a signal to a shield of the coaxial cable; and
    (b) receiving the coupled signal from a center conductor of the coaxial cable;
whereby the presence of a shield break is determined by receiving the coupled signal on the center conductor.

22. The method of claim 21 wherein the signal comprises an impulse.

* * * * *